US005472488A

United States Patent [19]

Allman

[11] Patent Number: 5,472,488
[45] Date of Patent: *Dec. 5, 1995

[54] COATING SOLUTION FOR FORMING GLASSY LAYERS

[75] Inventor: Derryl D. J. Allman, Colorado Springs, Colo.

[73] Assignees: Hyundai Electronics America, Milpitas, Calif.; At&T Global Information Solutions Company, Dayton, Ohio

[*] Notice: The term of this patent shall not extend beyond the expiration date of Pat. No. 5,302,198.

[21] Appl. No.: 210,386

[22] Filed: Mar. 18, 1994

Related U.S. Application Data

[63] Continuation-in-part of Ser. No. 582,570, Sep. 14, 1990, Pat. No. 5,302,198.

[51] Int. Cl.$^6$ .................. C09D 183/04; C09D 183/06; C09D 183/07; C09D 183/08

[52] U.S. Cl. .................. 106/287.16; 501/12; 525/477; 528/34; 528/38; 528/43

[58] Field of Search .................. 106/287.16; 525/477; 528/34, 38, 43; 501/12

[56] References Cited

U.S. PATENT DOCUMENTS

| | | |
|---|---|---|
| 3,258,477 | 6/1966 | Plueddemann et al. . |
| 3,402,191 | 9/1968 | Morehouse . |
| 3,544,498 | 12/1970 | Holdstock et al. . |
| 3,615,943 | 10/1971 | Genser . |
| 3,789,023 | 1/1974 | Ritchie . |
| 3,832,202 | 8/1974 | Ritchie . |
| 3,837,873 | 9/1974 | Pollack et al. . |
| 3,892,608 | 7/1975 | Kuhn . |
| 3,905,823 | 9/1975 | Piskoti . |
| 3,915,766 | 10/1975 | Pollack et al. . |
| 3,928,225 | 12/1975 | Schäfer . |
| 3,969,168 | 7/1976 | Kuhn . |
| 3,975,294 | 8/1976 | Dumoulin . |
| 3,986,997 | 10/1976 | Clark . |
| 4,152,286 | 5/1979 | Crosson et al. . |
| 4,173,490 | 11/1979 | Rotenberg et al. . |
| 4,338,375 | 7/1982 | Hashimoto et al. . |
| 4,439,239 | 3/1984 | Greigger et al. . |
| 4,447,498 | 5/1984 | Fink et al. . |
| 4,493,886 | 1/1985 | Lauks . |
| 4,509,981 | 4/1985 | Sanders, Jr. et al. . |
| 4,557,797 | 12/1985 | Fuller et al. . |
| 4,563,241 | 1/1986 | Tanaka et al. . |
| 4,571,366 | 2/1986 | Thomas et al. . |
| 4,587,138 | 5/1986 | Yau et al. . |
| 4,605,450 | 8/1986 | Thomas et al. . |
| 4,619,719 | 10/1986 | Thomas et al. . |
| 4,620,986 | 11/1986 | Yau et al. . |
| 4,621,042 | 11/1986 | Pampalone et al. . |
| 4,652,618 | 3/1987 | Sumida et al. . |
| 4,798,629 | 1/1989 | Wood et al. . |
| 4,808,653 | 2/1989 | Haluska et al. . |
| 4,835,089 | 5/1989 | Iwayanagi et al. . |
| 4,842,901 | 6/1989 | Merrem et al. . |
| 4,847,120 | 7/1989 | Gent . |
| 4,865,649 | 9/1989 | Kashiwagi et al. . |
| 4,885,262 | 12/1989 | Ting et al. . |
| 4,898,907 | 2/1990 | Haluska et al. . |
| 4,935,095 | 6/1990 | Lehrer . |
| 5,037,777 | 8/1991 | Mele et al. . |
| 5,100,503 | 3/1992 | Allman et al. . |
| 5,152,834 | 10/1992 | Allman . |
| 5,186,745 | 2/1983 | Maniar . |

FOREIGN PATENT DOCUMENTS

| | | |
|---|---|---|
| 0112168 | 6/1984 | European Pat. Off. . |
| 3014675 | 10/1981 | Germany . |
| 1097576 | 6/1984 | U.S.S.R. . |

OTHER PUBLICATIONS

Morimoto et al., "Manufacturable and Reliable Spin-on-Glass Planarization . . . Layer Technology", 5th Int'l. VLSI Multilevel Interconnect Conference Santa Clara, Calif. (Jun. 13–15, 1988), pp. 411–415.

*Primary Examiner*—David Brunsman
*Attorney, Agent, or Firm*—Wayne P. Bailey

[57] ABSTRACT

There is disclosed doped spin-on glass compositions such as boronoxide doped spin-on glass compositions with a high carbon content and silane adhesion promoter incorporated therein for use as coating layers on substrates such as silicon wafers.

11 Claims, No Drawings

COATING SOLUTION FOR FORMING GLASSY LAYERS

CROSS-REFERENCE TO RELATED APPLICATION

This application is a continuation-in-part of U.S. application Ser. No. 07/582,570, filed Sep. 14, 1990 now U.S. Pat. No. 5,302,198.

FIELD OF THE INVENTION

The present invention relates to a coating solution used in the production of semiconductor products commonly referred to as "spin-on glass compositions".

BACKGROUND OF THE INVENTION

A spin-on glass composition is a liquid, silica-based composition that can be applied to the surface of a semiconductor wafer and spun with the wafer to provide a coating with a level top surface. With this technique, the spin-on glass composition will fill in any valleys or recessed areas in the surface of the semiconductor wafer that result from the various insulating and conductive regions. The spin-on glass coating is then dried to form a solid layer and is subsequently cured at high temperatures to form a hard silica-based (glassy)layer. This hard layer may be etched in preparation for further processing.

Spin-on glass layers have been used for various purposes in semiconductor devices. For example, they have been used as planarizing layers, gettering layers for the removal of undesirable impurities, insulating layers for the isolation of multilayer metallizations, doping vehicles for semiconductor substrates and diffusion masks for enhancing contrast in photolithography techniques. Non-uniformity is undesirable for all these applications..

There are a number of materials said to be suitable for use as spin-on glass compositions. For example, U.S. Pat. No. 3,615,943 describes a coating solution that contains the reaction products of silicon tetrachloride and acetic anhydride. Alternative methods utilize tetraethoxysilane. For example, U.S. Pat. No. 3,832,202 to Ritchie describes a liquid spin-on silica source which comprises two components, one containing tetraethoxysilane, and the other comprising the reaction product of ethyl alcohol, ethyl acetate and vinyltrichlorosilane. Furthermore, U.S. Pat. No. 4,798,629 to Wood et al. describes a spin-on glass composition that comprises a mixture of tetraethoxysilane, methyltriethoxysilane and dimethyldiethoxysilane in a 2/1/1 relationship provide a polyorganosiloxane with an atomic weight percent carbon between 25% and 8%, preferably 11% and 9%, based on hydrolyzed organosilane.

Solutions of precondensed polyorganosiloxanes have also been described as suitable spin-on glass compositions. A coating solution which contains a prepolymer of polysilsesquioxane together with a polymer obtained from tetraethoxysilane or tetramethoxysilane is described in EPA 112,168 and Kashiwagi et al., U.S. Pat. No. 4,865,649, describes a coating solution comprising a cohydrozylate of at least two alkoxysilanes where di-, tri- and tetraalkoxysilanes are utilized.

Despite the various formulations, a number of limitations exist with respect to the production and use of most spin-on glass compositions. Problems of surface damage from subsequent processing, poor adhesion and short shelf life, among others, have limited the utility of these compositions. There is a continuing effort to obtain spin-on glass compositions which overcome these limitations.

Spin-on glass layers unavoidably have some brittleness so that cracks sometimes form during subsequent processing, especially where large thicknesses are necessary to completely fill the recessed areas and provide a level surface. Thick film spin-on glass layers are also subject to detachment from the substrate during subsequent processing. The maximum thickness of coating layers obtained from commercially available spin-glass compositions is about 5,000 Å for this reason. This limitation on thickness limits the applications for the spin-on glass composition. Differential thermal expansion between the spin-on glass layer and the underlying substrate contributes significantly to the cracking of the spin-on glass layer. In order to reduce the effect of differential thermal expansion, the gap between the adjacent peaks must be relatively large. This further limits the use of the spin-on glass composition to lower density (large dimension) semiconductors.

Good adhesion between the spin-on glass composition and the underlying chip surface is essential for successful chip production. Poor adhesion can result in incomplete filling of the recessed areas or surface imperfections (non-uniformity). Good adhesion has been achieved in conventional spin-on glass compositions by keeping the carbon content of the polysiloxane below 28 atomic weight %. Such a practice limits the performance of the spin-on glass composition. For example, Morimoto et al. have reported that spin-on glass planarity increases when the carbon concentration of the polysiloxane is increased from 4% to 28%, (see "Manufacturable and Reliable Spin-On Glass Planarization Process for 1 μm CMOS Double Layer Metal Technology", 5th Int'l. VLSI Multilevel Interconnect Conference, Santa Clara, Calif.; Jun. 13–15, 1988).

Instability is also a problem for most spin-on glass compositions. Spin-on glass compositions typically have a shelf life of less than six months, which makes it difficult to maintain stocks of large quantities.

A further limitation on spin-on glass compositions has been that the coating layers produced have a dielectric constant which falls in the range of 4–6. This is somewhat higher than the dielectric constant of pure oxide ($O_2$), which is 3.9. The high dielectric constant requires that there be more space between electrically isolated devices in order to provide equivalent insulating characteristics.

Another disadvantage of spin-on glass compositions has been that it is difficult to control the plasma etch rate of the layers produced since they are sensitive to the $O_2$ concentration. A typical etching process uses a plasma such as a mixture of $CHF_3$ and $O_2$. When the underlying oxide is exposed, it releases additional oxygen into the plasma, causing a significant increase in the etch rate of the spin-on glass layer. This can result in the formation of recesses and a loss of uniformity in the surface.

OBJECTS OF THE INVENTION

It is, therefore, an object of the present invention to provide a spin-on glass composition which will provide layers with superior adhesion to a substrate and superior resistance to damage from subsequent processing.

It is another object of the present invention to provide a process for producing a spin-on glass composition which will provide layers with improved adhesion to a semiconductor substrates and improved resistance to surface damage from subsequent processing.

It is another object of the present invention to provide a spin-on glass composition having a shelf life in excess of one year.

It is a further object of the present invention to provide a spin-on glass composition that will form layers which are resistant to oxygen concentration fluctuations when etching with $CHF_3$.

It is a further object of the present invention to provide a spin-on glass composition that will form layers with a dielectric constant lower than pure oxide ($O_2$) layers, i.e., below 3.9.

It is a further object of the present invention to provide a spin-on glass composition that can form layers in excess of 5,000 Å in thickness without cracking when subsequently processed.

In another aspect, it is an object of the present invention to provide a method for producing silica-based layers in excess of 5,000 Å on a semiconductor wafer from a spin-on glass composition.

In another aspect, it is an object of the present invention to provide a semiconductor device having a silica-based layer in excess of 5,000 Å thickness derived from a spin-on glass composition.

Upon further study of the specification and appended claims, further objects and advantages of this invention will become apparent to those skilled in the art.

SUMMARY OF THE INVENTION

The above objects are achieved in providing the spin-on glass composition described below and the methods for its production and use.

The spin-on glass composition of this invention comprises a solution of a crosslinked polyorganosiloxane having at least 15 atomic weight percent carbon and an organofunctional silane adhesion promotor incorporated therein. The silane adhesion promoters include aminoorganotri($C_1$–$C_4$)alkoxysilanes. The crosslinked polyorganosiloxanes can be characterized as polysilsesquioxanes due to the extent of crosslinking.

This invention also provides a process for producing a spin-on glass composition which comprises dissolving a polyorganosiloxane having a carbon content of at least 15 atomic weight percent in an inert organic solvent, reacting the dissolved polyorganosiloxane with a siloxane adhesion promoter under alkaline conditions and reducing the pH of the reaction medium sufficiently to arrest the reaction between the polyorganosiloxane and the silane adhesion promoter.

This invention further provides a method of forming a silica-based layer in a semiconductor device which comprises applying a spin-on glass composition of the present invention to a semiconductor wafer, spinning said semiconductor wafer at speeds which provide a uniform layer of the spin-on glass composition, drying the layer on said semiconductor wafer and heating said semiconductor wafer to a temperature sufficiently high to cure the dried spin-on glass layer.

Also provided by this invention are semiconductor devices having a silica-based layer derived from a spin-on glass composition of this invention.

DESCRIPTION OF A PREFERRED EMBODIMENT

The spin-on glass composition of the present invention is a solution of a crosslinked polyorganosiloxane having a carbon content of at least 15 atomic weight % carbon which has a silane adhesion promoter incorporated therein. To achieve a high carbon content, the backbone of the crosslinked polyorganosiloxane is derived from a mixture of alkoxysilanes, some or all of which are substituted with organic radicals, preferably $C_1$–$C_4$-alkyl radicals and phenyl radicals. The carbon content is determined by the number of such organosubstituted alkoxysilanes incorporated in the polymer chain.

The preferred substituents are methyl and phenyl radicals. These substituents show high bonding energy with silica and do not dissociate when the spin-on glass layer is exposed to high temperatures during cure. Other alkyl substituents such as ethyl, propyl and butyl radicals are acceptable where this dissociation can be avoided or ignored.

In preferred embodiments which do not contain dopants, such as boron-oxide dopant, the crosslinked polyorganosiloxane has both methyl and phenyl radicals as substituents. Spin-on glass compositions having only phenyl substituents on the siloxane polymer provide layers which are difficult to etch with conventional equipment. The ratio of methyl to phenyl substituents preferably ranges from 1:1 to 1:3. Most preferably, a portion of the silica atoms in the crosslinked polyorganosiloxane have both methyl and phenyl substituents bonded thereto. This can be accomplished where the crosslinked polyorganosiloxane is derived from methylphenylalkoxysilanes. Such crosslinked polyorganosiloxanes provide coating layers with excellent resistance to cracking from subsequent processing. Where the crosslinked polyorganosiloxane has a dopant as discussed below, such as a boron-oxide dopant incorporated therein, methyl is the preferred substituent. Polymers based on methyl substituted monomers form films with better resistance to oxygen ashing than films from methyl-phenyl based polymer due to a lower carbon content.

The high organic content contributes to a low silanol content and low alkoxy content in the crosslinked polyorganosiloxanes used within the spin-on glass compositions. Preferably, the silanol content is less than 1.5 wt. % and the alkoxy content is less than 0.1 wt. %. These low values are also attributed to the cross-links in the polymer. The carbon content for the boron-oxide doped polyorganosiloxane polymers typically range from 15–50 wt. %, more typically 15–40 wt. %, including 20 and 30 wt. % carbon.

The carbon content of the crosslinked polyorganosiloxane can be determined using thermalgravimetric analysis, wherein a weighed sample is decomposed as it is heated slowly in a thermoanalyzer. The weight of the residue is then compared to the initial weight and the difference is considered lost organic material.

Incorporated within the crosslinked polyorganosiloxane used in the spin-on glass compositions of the present invention is a silane adhesion promoter. These silanes are well known in the in the industry for improving the adhesion between organic resins and inorganic media such as glass, sand or fillers. These silane adhesion promoters have two types of substituents, one is an organofunctional radical bonded directly to the silicon atom and the other is an organic substituent bound through oxygen such as $C_1$–$C_4$-alkoxy or $C_2$–$C_4$-acetoxy. These alkoxy/acetoxy groups allow for incorporation of the silane into the crosslinked polyorganosiloxane. Preferably, the organofunctional silane has three $C_1$–$C_4$-alkoxy groups and, most preferably, they are ethoxy or methoxy.

The organofunctional groups are typically electrophilic. Commercially available silane adhesion promoters have aminoorgano-, ureido- organo- or glycidoxyorgano-functional groups. Aminoorganotri($C_1$–$C_4$)-alkoxysilanes are preferred, examples of which include gamma-aminopropyltriethoxysilane, gamma-aminopropyltrimethoxysilane, N-beta-(aminoethyl)-gamma-aminopropyltriethoxysilane and N-beta-(aminoethyl)-N-beta-(aminoethyl)-gamma-aminopropyltrimethoxysilane. The most preferred organofunctional silane adhesion promoter is gamma-aminopropyltriethoxysilane.

The aminoorganotri($C_1$–$C_4$)alkoxysilanes are preferably incorporated at levels of 10–50 weight percent of the crosslinked polyorganosiloxane. Such levels provide a significant degree of crosslinking. The polymer obtained can be characterized as a polyorganosilsesquioxane due to the crosslinking obtained. The crosslinked organopolysiloxanes used in the spin-on glass compositions of the present invention may have a structure consistent with the "cubical octamer" structure, double chain "ladder" structure or both. A. J. Barry et al. describe these structures in Chapter 5 of *Inorganic Polymers*, Ed. Stone and Graham, New York, Academic Press, 1962, p. 195. These are complicated structures which result from the trifunctionality of the trialkoxysilanes having but one organic group on each silicon atom. Although tetraalkoxysilanes and diorganoalkoxysilanes can be incorporated in these polymers, a significant portion of the polymer is derived from trifunctional silanes.

The weight average molecular weight of the crosslinked polyorganosiloxane polymer used in the spin-on glass composition of the present invention may range from about 2,000 up to above 20,000, including 500 to 200,000. The only limits on the polymer molecular weight are that the polymer must be soluble in an inert organic solvent and that the solution formed be sufficiently low in viscosity to allow uniform coating. In the spin-on glass compositions of this invention, the crosslinked polyorganosiloxane is in solution, preferably at a concentration of from about 5 to 20 wt. % solids. Suitable solvents include monohydric and polyhydric alcohols and glycol ethers. The following are mentioned as examples of suitable monohydric alcohols: 1-butanol, 2-butanol, 2-methyl-1-propanol, 2-methyl-2-propanol and 1-phenol. Suitable polyhydric and oligomeric alcohols are: ethyleneglycol-monoethylether, diethyleneglycolmonoethylether, triethyleneglycolmonoethylether, propyleneglycolmonoethylether, dipropyleneglycolmonoethylether and dipropyleneglycolmonomethylether. Mixtures of these alcohols are also suitable. To facilitate drying, the inert organic solvent should have a boiling point below 250° C., preferably above 80° C. Preferably, N-butanol and isopropyl are used.

The spin-on glass composition of the present invention has a pH in the range of 3–7, preferably from 6–6.7. The acidic pH is provided by an organic acid or hydrogen peroxide. The preferred acid is acetic acid. The viscosity of the spin-on glass composition preferably ranges from about 3.5 to 9 centistokes at the preferred solids level of 5 to 20 wt. %. If the viscosity is too low, multiple coats are necessary to obtain a thick spin-on glass layer. If the viscosity is too high, uniformity may be difficult to achieve when coating a substrate.

The spin-on glass compositions of the present invention are stable, i.e., they do not increase in viscosity at ambient temperature, for periods in excess of one year.

The method of this invention for preparing spin-on glass compositions involves dissolving a polyorganosiloxane having a carbon content of at least 15 wt. % within an organic solvent. The solvent is preferably a mono- or polyhydric alcohol or glycol ether having a boiling point of less than 250° C. and preferably greater than 80° C. Suitable species are as described above. N-butanol and isopropyl alcohol are preferred. Propyl propasol is a preferred solvent when preparing boron-oxide doped spin-on glass formulations.

Polyorganosiloxanes with a high carbon content can be obtained by cohydrolyzing a mixture of alkoxysilanes, some or all of which are substituted with organic radicals, preferably $C_1$–$C_4$-alkyl and phenyl radicals. As precursors to the polymers in the spin-on glass composition of the present invention, these polyorganosiloxane contain the desired level of methyl and phenyl substituents. Therefore, the methyl to phenyl ratio preferably ranges from 1:1 to 1:3, as in the crosslinked polyorganicsiloxanes described above. Furthermore, these polyorganosiloxanes will contain those silicon atoms having both methyl and phenyl groups bound thereto.

The polyorganosiloxanes used in the process of this invention may be linear or they may have a significant number of crosslinks to the extent that they are polysilsesquioxane polymers. They are limited in structure and molecular weight only to the extent that they must remain soluble within an inert organic solvent.

Two or more polyorganosiloxanes may be used in varying proportions in the process of this invention to provide the spin-on glass compositions. However, it is preferable if blends are not used so as to ensure a consistent structure.

The silanol content of the polyorganosiloxanes are low due to the high organic content and sometimes, also due to crosslinking. Preferably, the silanol content is below 13 wt. % and the alkoxy content is less than 10 wt.%.

The carbon content in the preferred polymethylphenylsiloxanes ranges from about 40–50 atomic weight percent; however, the polyorganosiloxanes with a higher carbon content are suitable. The carbon content of the polymethylsiloxanes used in boron-oxide doped formulations is typically from 15–40 wt. %.

In preparing doped polyorganosiloxanes such as boron-oxide doped polyorganosiloxanes, the polymer is reacted with a reactive boron-oxide compound such as by refluxing with boric acid in a weight ratio between 1 to 15:100 boric acid to polymers for about 1–12 hours, more typically about 4 hours for preferred levels of boron-oxide dopants. Long reflux times can be used to build up the molecular weight and provide thicker films. The solvent to polymer weight ratio preferably falls within the range of 1–2:1 solvent to polymer.

The dissolved polyorganosiloxane is reacted with a silane adhesion promoter, preferably an aminoorganotri-($C_1$–$C_4$)-alkoxysilane, most preferably gamma-aminopropyltriethoxysilane, under alkaline conditions. The aminoorganotri($C_1$–$C_4$)alkoxysilanes are sufficiently alkaline so as not to require addition of a base to the solution. Where the silane adhesion promoter is non-alkaline, it is expected a volatile organic amine may be introduced to promote reaction. The pH of the reaction medium is preferably 11 or above.

The amount of silane adhesion promoter reacted with the polyorganosiloxane can vary widely, but is preferably used in a weight ratio within the range of 0.11:1 to 1:1 of silane to polyorganosiloxane.

The pH of the reaction medium is reduced when it is desirable to slow down or arrest the reaction. The duration of the reaction will depend on the reaction rate, which is influenced by temperature. Allowing the reaction to proceed for eight hours or more is preferred when conducted at ambient temperature. It is often desirable to terminate the reaction following the formation of a precipitate, as a precipitate is indicative of the formation of insoluble polymers, which must be removed from the spin-on glass composition. A reaction that proceeds for two hours or more at ambient temperature will be effective in producing spin-on glass compositions.

To substantially arrest the reaction, the pH should be reduced below 7, but not below 3.0, or acid catalyzed hydrolysis will proceed. The preferred pH range is 5 to below about 7, most preferably 6 to 6.7. This can be accomplished by the addition of an organic acid, such as acetic acid or hydrogen peroxide. The use of acetic acid is preferred.

Once the reaction has been stopped, it is preferable to age the composition before use, preferably for about one week. It is also preferable to filter the solution with a submicron filter, such as a 0.2 micron teflon filter, so as to remove any precipitate that forms during reaction. The composition will remain stable thereafter for periods in excess of one year.

The spin-on glass composition of this invention can be applied to a substrate by a conventional spin-coat technique wherein a substrate (wafer) is spun at a rate in excess of 1,000 rpm to generate a uniform layer of the spin-on glass composition. The thickness of the layer can be modified by varying the viscosity of the spin-on glass composition. The spin-on glass composition is then dried by heating the wafer to about 200° C. Layers in excess of 5,000 Å can be obtained by multiple applications. After the coating is dried, the coated substrate is heated to a temperature of from about 350°–500° C. to cure the spin-on glass coating and form a smooth, uniform silica-based layer. The spin-on glass composition preferably exhibits low shrinkage once dried. Vertical shrinkage as high as 11% may be acceptable, however, it is preferable for shrinkage to be below about 10%, which is easily obtained with preferred embodiments.

Spin-on glass compositions of the present invention can provide uniform oxide layers in excess of 5,000 Å without cracking or loss in subsequent processing. Therefore, complete operational semiconductor devices may have incorporated therein silica-based layers derived from a spin-on glass composition of the present invention.

The dielectric constant of these silica-based layers is about 2.4, which is below that of the standard oxides (3.9) and below that of conventional spin-on glass materials (4.5).

The silica-based layers provided by the spin-on glass compositions of the present invention show superior resistance to oxygen during etching with $CHF_3$ and $O_2$, particularly where the undoped crosslinked polyorganosiloxane contains a large number of phenyl radicals. Boron-oxide doped polyorganosiloxane with a lower carbon content (methyl substitution) show superior resistance to oxygen ashing than high carbon content polymers (phenyl substitution). These silica-based layers are therefore also resistant to changes in etch rate from changes in oxygen content. A change in etch rate of less than 100 Å per minute is typical where the oxygen flow rate during etch with $CHF_3$ is increased from 6 to 9 SCCM. For layers obtained from conventional spin-on glass compositions, such as Accuglass 108 and Owens Techneglass®, which has a carbon content of about 13 wt. %, the etch rate increases by more than 100 Å per minute.

Dopants such as phosphorous and boron, including boron oxide, may be introduced into the spin-on glass compositions of the present invention where a dopant layer is desired. Dopant concentrations of about 5 wt. % to 30 wt % are suitable. The amount of boron oxide within the spin-on glass formulation can vary widely and is preferably greater than 1 wt. %, most preferably between 2–5 wt. %, based on the weight of the formulation. When introduced into the spin-on glass formulation, the boron-oxide dopant is incorporated into the polymer.

The spin-on glass compositions of this invention can be used to form silica-based coating layers on substrates such as semiconductors, silica wafers, glass plates, metal plates and the like by any known method including the spin method, roller coater method, dipping and pull-up method, spray method, screen printing method, brushing method and the like.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth in degrees Celsius, unless otherwise indicated, all parts and percentages are by weight.

The entire disclosure of all applications, patents and publications, cited above and below, are hereby incorporated by reference.

EXAMPLES

Example 1

A spin-on glass composition was prepared by dissolving 52 g of polymethylphenylsiloxane polymer in 800 ml of N-butanol. The polymer was obtained from Owens, Ill. as solid flakes. The silanol content of the polymer was about 13% to 14% by weight and the ethoxy content was about 8% by weight. The carbon content was above 40 atomic weight percent as determined by thermalgravimetric analysis of an earlier sample, wherein the sample was weighed and heated up to 600° C. at a rate of 2° C. per minute and cooled at the same rate to ambient temperature. The residue was weighed after cooling and the weight loss was taken as the carbon content. A quantity of aluminum oxide was heated alongside the resin sample and showed no weight loss or gain from the thermalgravimetric analysis.

The polyorganosiloxane dissolved in the N-butanol within one half hour, after which, 7.2 ml of gamma-aminopropyltriethoxysilane was added by pipet with stirring within one minute. The silane was distilled from a silane solution sold by Union Carbide under the designation A1100. The solution was maintained at a constant temperature (23° C.) during reaction, which was allowed to continue for about 8 hours with stirring, after which 7.0 ml of acetic acid (electronic grade) was added. A precipitate had formed within the solution.

After the addition of acid, the pH fell to about 6.5. The solution was aged for one week and subsequently filtered to 0.2 micrometers with a teflon filter to remove the precipitate. The solids concentration of the solution was about 6 wt. % and the viscosity was about 4 centistokes. The polymethylphenylsilsesquioxane polymer produced had a silanol content of about 1.5% and an alkoxy content of less than 0.1%.

Boron-Oxide Doped, Spin-on Glass Formulation

The following process is suitable to incorporate the boron-oxide dopant into a polyorganosiloxane polymer. The polyorganosiloxane resin is mixed with either propylene glycol monomethylether (PM), propyleneglycolmonomethylether acetate (PMA) or propylpropasol (PP). The solution is then slurried. The optimum concentration of the flaked resin to solvent is 25 grams of resin to 50 grams of solvent. When a solid resin is used, the same proportions are to be used. When the resin used is liquid at 50% solids, then a 50:50 mix is used. To the resin-solvent solution, 3 grams of boric acid is dissolved. The solution is refluxed for 4 hours in a nitrogen ambient. The solution is then diluted with 25 grams of solvent to stabilize the mixture where the solution can be frozen until the next step. This is called the parent solution. Optionally, distilled A1100 trimethoxyaminopropylsilane is added to the parent solution. The amount of A1100 is equal to 1% of the total volume of the parent solution. The solution is stirred and the A1100 is allowed to react for 1 to 4 hours. The reaction of the parent with the A1100 causes the polysiloxane polymer to condense further and strip the OH groups off the base polysiloxane polymer. The A1100 reaction can be quenched by adding either acetic acid or formic acid to the solution. The amount of acid is equal to 1 to 10 times the A1100 concentration. After the solution is quenched, solvent is added to the solution to reduce the resin solids content down to 50% or lower.

Not wishing to be bound by theory, it is believed that the oxygen radical in the plasma reacts with the boron to form a $B_2O_3$ oxide crust or $B_2O_3$ crystals which fill the pores in the polymer network which inhibits further diffusion of the oxygen radicals or ozone into the spin-on glass layer. The preferred solvents are N-butanol or propyl propanol which allows the parent solution to be refluxed with the boric acid at a higher temperature providing a denser solid film.

Each spin-on glass formulation was applied to several bare silicon wafers consistent with the procedure below to form a spin-on glass layer.

Spin-On Glass Layer

A 1 g solution was applied to a silicon wafer 4 inches in diameter. The wafer was rotated on a spinner for about 3 seconds at 1000 rpm and then at 4,500 rpm for 30 seconds. The composition coated the wafer uniformly without bubble formation or blistering. The wafer was then transferred to an Ellipsometer to determine thickness and refractive index at different points on the wafer. The refractive index had an average value of about 1.5 and the average thickness was about 1,500 Å. Following the measurement, the wafer was transferred to a hot plate and heated to about 200° C. for 1 minute to dry the coating. The coating thickness and refractive index were measured again with the Ellipsometer and percent vertical shrinkage was calculated to be about 7%.

The coating procedure was repeated until the multiple layers had a total thickness in the range of 4,000–20,000 Å.

Once the desired thickness was obtained, the wafer was transferred to a tube furnace and heated to about 400° C. under nitrogen for 60 minutes. The centers of the wafers were then measured using an Ellipsometer to determine the index of refraction and the thickness of the wafer at 9 points, the average of these values are reported as the coating thickness and refractive index. The refractive index was about 1.49 and the thickness was within the range of 4,000–7,000 Å. No cracks or pin holes were detected in the coating.

Aging Test

An accelerated aging test was used to determine the stability of the spin-on glass compositions of the present invention. A spin-on glass composition produced in accordance with the procedure described above was stored at 55° C. after filtration together with a separate sample of the commercially available spin-on glass composition, Accuglass 110, available from Allied Chemical. Accuglass 110 is known to have a shelf life of 6 months at ambient temperature. The viscosity values of both samples were monitored over time when stored at this temperature. The viscosity of the Accuglass 110 steadily increased and eventually a precipitate formed, while the sample produced in accordance with this invention did not show any indication of an increase in viscosity during that same period. When compared to the stability of Accuglass 110, the composition of the present invention will have a shelf life beyond one year.

Etching Process

A silica-based film prepared as described above was subjected to etch with $CHF_3$ and $O_2$ in an AME 8110 unit. The etch rate for a number of samples were determined with different oxygen flow rates. The etch rates of silica-based films obtained from two commercially available spin-on glass compositions were also tested at different oxygen flow rates. The results are summarized in the table below:

TABLE 1

| Example 1 (300° C.) | Etch Rate Å/min | ACC[1] 108 (425° C.) | ACC[2] 110 (425° C.) |
| --- | --- | --- | --- |
| 4 | | | 150 |
| 5 | | 120 | 175 |
| 6 | 60 | | |
| 7 | | 190 | 225 |
| 8 | 75 | | |
| 9 | | 280 | 350 |
| 10 | 110 | | |
| 13 | 160 | | |
| 15 | 220 | | |
| 17 | 225 | | |

[1]ACC 108 = Accuglass 108 (Allied Chemical).
[2]ACC 110 = Accuglass 110 (Allied Chemical).

The data in Table 1 shows the high resistance of the silica-based layers produced by the composition of the present invention to changes in the oxygen concentration when etching with $CHF_3$. An etch rate which matches that of a plasma oxide can be obtained at high oxygen flow rates. (15 ccm to 18 ccm). The release of oxygen from the underlying oxide during etch will have little effect on $O_2$ concentration at these high oxygen flow rates, allowing for a more uniform etch across the surface of a semiconductor wafer.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A coating solution for forming glassy layers comprising a solution of crosslinked polyorganosiloxane having at least 30 wt. % carbon and a silane adhesion promoter incorporated therein and a dopant.

2. A spin-on glass composition comprising a solution of crosslinked polyorganosiloxane having at least 15 wt. % carbon and a silane adhesion promoter incorporated therein and a boron-oxide dopant.

3. A spin-on glass composition as in claim 2, wherein the polyorganosiloxane is a polymethylsiloxane and contains at least 1 wt. % boron-oxide.

4. A spin-on glass composition as in claim 2, wherein 10 to 50 wt. % of the crosslinked polyorganosiloxane is derived from the aminoorganotri($C_1$–$C_4$)alkoxysilane.

5. A spin-on glass composition as in claim 4, wherein the aminoorganotrialkoxysilane is gamma-aminopropyltriethoxysilane.

6. A spin-on glass composition as in claim 5, which additionally comprises butyl alcohol as a solvent.

7. A spin-on glass composition as in claim 4, wherein the silanol content is below 1.5 weight percent and the alkoxy content is below 0.1 weight percent in the crosslinked polyorganosiloxane.

8. A spin-on glass composition as in claim 2 comprising a solution of polymethylsilsesquioxane having a carbon content of at least 15 weight percent, an aminoorganotrialkoxysilane incorporated therein and 2–5 wt. % boron-oxide incorporated therein.

9. A spin-on glass composition as in claim 8, wherein the aminoorganotrialkoxysilane is gamma-aminopropyltriethoxysilane and from 10 to 50 weight percent of the polymethylsilsesquioxane is derived from said gamma-aminopropyltriethoxysilane.

10. A spin-on glass composition as in claim 8, which additionally comprises butyl alcohol and acetic acid.

11. A spin-on glass composition comprising a solution of cross-linked polyorganosiloxane which has 15–50 atomic wt. % carbon, alkyl groups of from 1 to 4 carbon atoms, an aminoorganotrialkoxysilane incorporated therein and a boron-oxide dopant incorporated therein.

* * * * *